(12) United States Patent
Chen et al.

(10) Patent No.: US 10,085,561 B2
(45) Date of Patent: *Oct. 2, 2018

(54) SLIDE RAIL ASSEMBLY AND BRACKET DEVICE THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Kai-Wen You, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/953,436

(22) Filed: Nov. 30, 2015

(65) Prior Publication Data

US 2017/0013959 A1 Jan. 19, 2017

(30) Foreign Application Priority Data

Jul. 15, 2015 (TW) .............................. 104123020 A

(51) Int. Cl.
*A47B 96/06* (2006.01)
*A47B 96/07* (2006.01)
*H05K 7/14* (2006.01)

(52) U.S. Cl.
CPC ............ *A47B 96/07* (2013.01); *A47B 96/067* (2013.01); *H05K 7/1489* (2013.01)

(58) Field of Classification Search
CPC ....... A47B 96/07; A47B 96/067; A47B 96/06; A47B 46/00; A47B 47/0058;
(Continued)

(56) References Cited

U.S. PATENT DOCUMENTS 6,655,534 B2 * 12/2003 Williams ............... A47B 88/43
211/190
7,192,103 B2 * 3/2007 Hamilton ............... A47B 88/43
211/175

(Continued)

FOREIGN PATENT DOCUMENTS

CN 102695396 9/2012
EP 2 540 191 A1 1/2013

(Continued)

*Primary Examiner* — Kimberly T Wood
(74) *Attorney, Agent, or Firm* — Winston Hsu

(57) ABSTRACT

A slide rail assembly includes a rail element, a first bracket, an extension frame, a second bracket, a blocking element, and an elastic element. The first bracket is mounted to the rail element and configured to be mounted to a first post. The extension frame is movable relative to the rail element. The second bracket is mounted to the extension frame and configured to be mounted to a second post. The blocking element is movably connected to the second bracket. The elastic element is configured to provide an elastic force to hold the blocking element at a first position relative to the second bracket. When the extension frame is driven by the rail element to move along a direction, the extension frame pushes the blocking element to move from the first position to a second position, such that the second bracket is detachable from the second post.

4 Claims, 15 Drawing Sheets

(58) Field of Classification Search
CPC ... A47B 88/044; A47B 96/068; A47B 96/145; A47B 96/1441; H05K 71/1489
See application file for complete search history.

(56) References Cited

U.S. PATENT DOCUMENTS

| | | | | |
|---|---|---|---|---|
| 7,281,694 B2* | 10/2007 | Allen | ................ | A47B 96/068 211/183 |
| 7,988,246 B2 | 8/2011 | Yu | | |
| 8,079,654 B2* | 12/2011 | Yu | ................ | A47B 88/43 211/26 |
| 8,146,756 B2* | 4/2012 | Brock | ................ | A47B 96/06 211/192 |
| 8,353,494 B2* | 1/2013 | Peng | ................ | A47B 88/43 211/192 |
| 8,727,138 B2* | 5/2014 | Dittus | ................ | H05K 7/1489 211/26 |
| 8,770,528 B2* | 7/2014 | Chen | ................ | H05K 7/1421 211/26 |
| 8,919,897 B2 | 12/2014 | Chen | | |
| 9,125,489 B2* | 9/2015 | Chen | ................ | A47B 88/044 |
| 9,237,808 B2 | 1/2016 | Chen | | |
| 9,328,769 B1* | 5/2016 | Chen | ................ | H05K 7/1489 |
| 9,402,475 B2* | 8/2016 | Gu | ................ | A47B 88/044 |
| 9,480,183 B2* | 10/2016 | Chen | ................ | H05K 7/183 |
| 2005/0156493 A1* | 7/2005 | Yang | ................ | A47B 88/43 312/334.5 |
| 2009/0166485 A1* | 7/2009 | Chen | ................ | A47B 88/43 248/200 |
| 2009/0294393 A1 | 12/2009 | Chen | | |
| 2009/0309471 A1* | 12/2009 | Yu | ................ | A47B 88/43 312/334.44 |
| 2010/0327135 A1* | 12/2010 | Selvidge | ................ | A47B 96/06 248/221.11 |
| 2011/0290746 A1* | 12/2011 | Lu | ................ | H05K 7/1489 211/26 |
| 2012/0145850 A1* | 6/2012 | Yu | ................ | H05K 7/1489 248/220.22 |
| 2012/0193489 A1* | 8/2012 | Yu | ................ | H05K 7/1489 248/201 |
| 2012/0292928 A1* | 11/2012 | Chang | ................ | H05K 7/1489 292/273 |
| 2014/0070064 A1* | 3/2014 | Chen | ................ | A47B 88/044 248/221.11 |
| 2014/0363108 A1* | 12/2014 | Chen | ................ | A47B 88/044 384/22 |
| 2015/0069196 A1* | 3/2015 | Chen | ................ | A47B 47/0058 248/218.4 |
| 2015/0201754 A1* | 7/2015 | Chen | ................ | A47B 96/025 248/219.3 |
| 2015/0335156 A1* | 11/2015 | Chen | ................ | A47B 96/07 248/219.1 |
| 2016/0097229 A1* | 4/2016 | Chen | ................ | A47B 88/40 16/94 R |

FOREIGN PATENT DOCUMENTS

| | | | | |
|---|---|---|---|---|
| EP | 2425744 | B1 | 9/2015 | |
| EP | 2979582 | A1 * | 2/2016 | ........... H05K 7/1489 |
| JP | 3153485 | U | 9/2009 | |
| JP | 2009297521 | A | 12/2009 | |
| JP | 3170804 | U | 9/2011 | |
| JP | 3192322 | U | 8/2014 | |

* cited by examiner

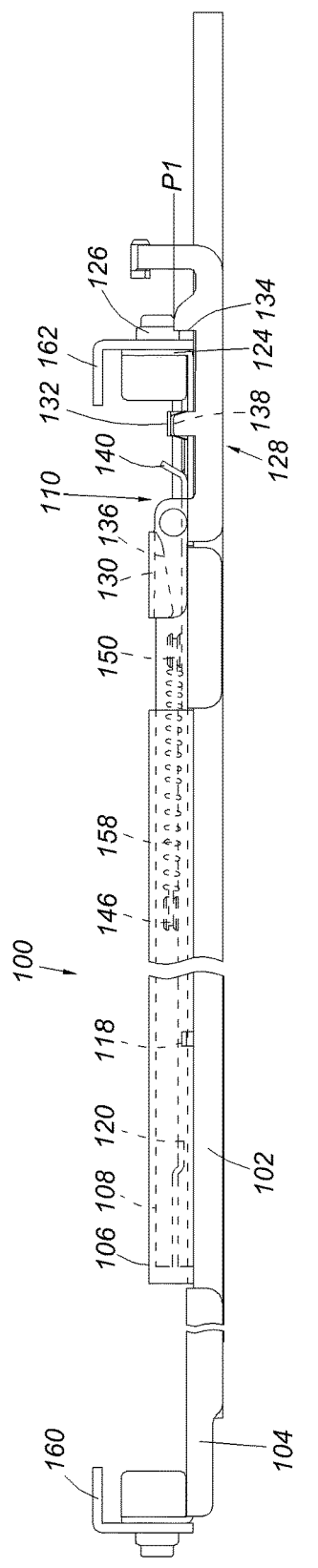
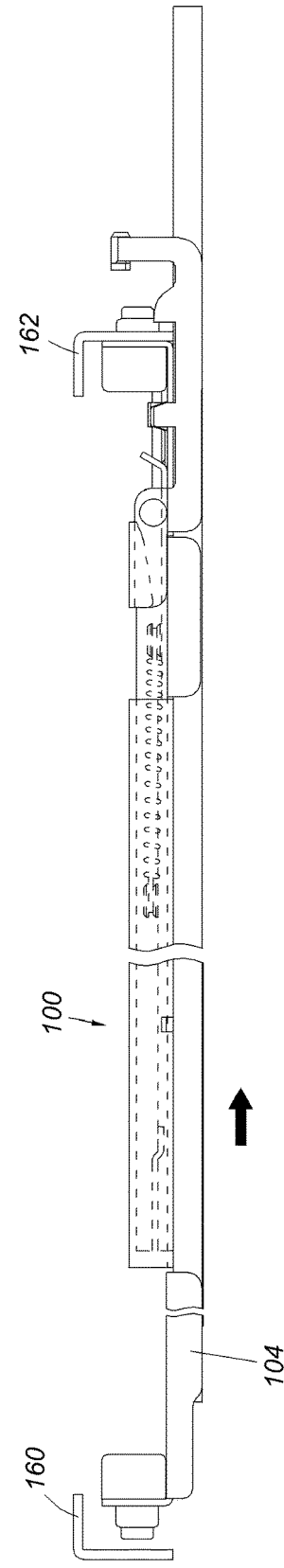
FIG. 4
FIG. 5

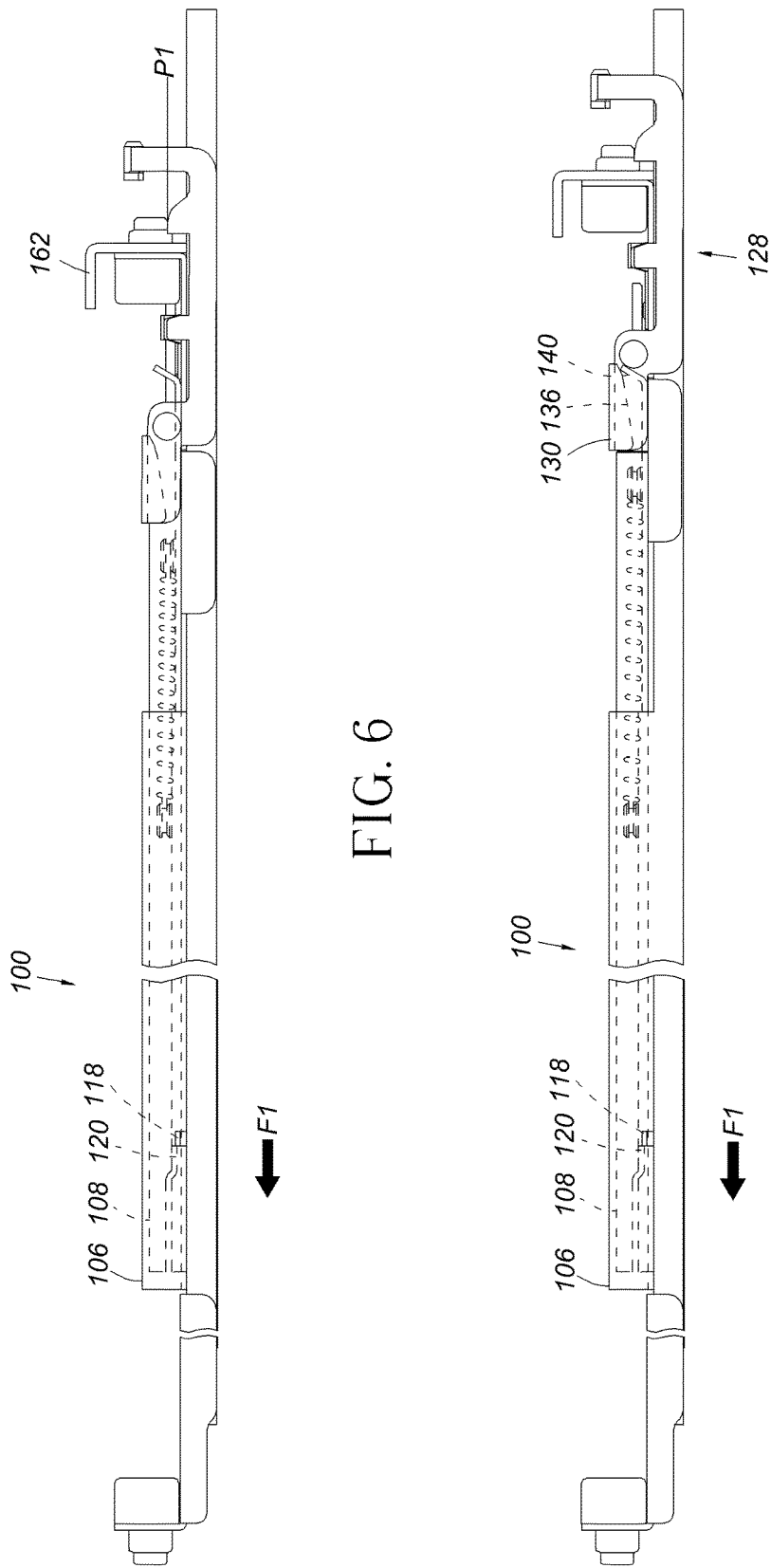

SLIDE RAIL ASSEMBLY AND BRACKET DEVICE THEREOF

BACKGROUND OF THE INVENTION

1. Field of the Invention

The present invention relates to a slide rail assembly, and more particularly, to a slide rail assembly capable of being easily mounted to or detached from a rack by a single person when operating in front of the rack.

2. Description of the Prior Art

China patent publication number CN102695396B discloses a slide rail tool free mounting frame for a server, which comprises a pair of frame positioning columns (4) arranged on a slide rail back mounting frame (1) and a frame floating hook (2). The frame floating hook (2) includes a pair of hooks (230) respectively arranged on a pair of wings (205), which are respectively provided with slide guide sleeves (201) and are in fixed connection through an ' arch door' shaped bending piece (206). The slide rail back mounting frame (1) is fixed with two slide guide columns (101), which are sleeved in the slide guide sleeves (201) and are in fixed connection through limit screws (7). First return springs (6) are arranged on the slide guide sleeves (201) between the wings (205) and the limit screws (7). The slide rail back mounting frame (1) is further provided with a floating pin hole (104) for placing a floating pin (3). One end of the floating pin (3) is connected to the 'arch door' shaped bending piece (206) through the limit screws (7), and the other end of the floating pin is a conical head (301) arranged in the floating pin hole (104). Second return springs (5) are arranged on the floating pin (3) between an end face of the conical head (301) and the limit screws (7).

According to such arrangement, although the prior art can lock or release the slide rail back mounting frame (1) through the floating pin (3) driven by an outer rail of the slide rail covered by a back frame. However, the prior art needs to drive the floating pin (3) to move through the outer rail of the slide rail, for lifting the frame floating hook (2), so as to lock the slide rail back mounting frame (1). But such locking operation, which drives the floating pin (3) through the outer rail of the slide rail, may reduce adjustment amount of extension of the slide rail, such that the slide rail is not applicable to racks with different depths, especially to a deeper rack. On the other hand, the prior art discloses a more complex structure, which may cause higher component cost and more assembly working hours.

SUMMARY OF THE INVENTION

The present invention relates to a slide rail assembly capable of easily detaching a bracket from a rack.

According to an embodiment of the present invention, a slide rail assembly is configured to be mounted to a first post and a second post of a rack. The slide rail assembly comprises a rail element, a first bracket, an extension frame, a second bracket, a blocking element and an elastic element. The first bracket is mounted to the rail element and configured to be mounted to the first post of the rack. The extension frame is movable relative to the rail element. The second bracket is mounted to the extension frame and configured to be mounted to the second post of the rack. The blocking element is movably connected to the second bracket. The elastic element is configured to provide an elastic force to hold the blocking element at a first position relative to the second bracket. Wherein, when the extension frame is moved along a direction opposite to a direction toward the second post for pushing the blocking element to move from the first position to a second position, the second bracket is detachable from the second post.

According to another embodiment of the present invention, a bracket device comprises a bracket, a blocking element, an elastic element and an extension frame. The blocking element is pivoted to the bracket. The elastic element is configured to provide an elastic force to hold the blocking element at a first position relative to the bracket. The extension frame is movably mounted to the bracket. Wherein, the extension frame is configured to push the blocking element to move from the first position to a second position.

According to another embodiment of the present invention, a bracket device comprises a bracket, a blocking element, an extension frame, at least one connection element and at least one spring. The blocking element is movably connected to the bracket. The blocking element has an inclined guiding feature. The extension frame is mounted to the bracket. The extension frame has a contact feature for abutting against the guiding feature of the blocking element, in order to move the blocking element from a first position to a second position relative to the bracket. The extension frame comprises at least one extension hole. The least one connection element passes through the at least one extension hole for movably mounting the extension frame to the bracket. The at least one spring is connected between the at least one connection element and the extension frame.

According to one of the above embodiments, the second bracket comprises a side plate, an end plate substantially perpendicularly extended from the side plate, and a mounting element mounted to the end plate. The blocking element is pivoted to the side plate of the second bracket and comprises a contact part and a blocking part. The elastic element is attached to the side plate of the second bracket for providing the elastic force to the contact part of the blocking element. The blocking part of the blocking element is held at the first position relative to the mounting element of the second bracket in response to the elastic force of the elastic element. The blocking element further comprises a guiding feature. The extension frame comprises a contact feature for abutting against the guiding feature of the blocking element. One of the guiding feature of the blocking element and the contact feature of the extension frame is inclined. Wherein, when the blocking element is driven to rotate in response to a movement of the contact feature of the extension frame when abutting against the guiding feature, the blocking part of the blocking element is moved from the first position to the second position relative to the mounting element of the second bracket.

According to one of the above embodiments, one of the extension frame and the second bracket further comprises at least one extension hole. The slide rail assembly further comprises at least one connection element passing through the at least one extension hole for movably mounting the extension frame to the second bracket. The slide rail assembly further comprises at least one spring connected between the at least one connection element and the extension frame.

According to one of the above embodiments, the second bracket comprises a side plate, an end plate substantially perpendicularly extended from the side plate, and a mounting element mounted to the end plate. The blocking element is pivoted to the side plate of the second bracket and comprises a first guiding feature. The extension frame comprises a contact feature. The elastic element is configured to provide the elastic force to drive the contact feature of the extension frame to abut against the first guiding feature of the blocking element. The blocking element is held at the first position relative to the second bracket. The blocking element further comprises a second guiding feature and a blocking part. The first guiding feature and the second guiding feature of the blocking element have different angles of inclination. The contact feature of the extension frame is inclined. Wherein, when the blocking element is driven to rotate in response to a movement of the contact feature of the extension frame when abutting against the second guiding feature, the blocking part of the blocking element is moved from the first position to the second position relative to the mounting element of the second bracket. One of the extension frame and the second bracket further comprises at least one extension hole. The slide rail assembly further comprises at least one connection element passing through the at least one extension hole for movably mounting the extension frame to the second bracket. The elastic element is connected between the at least one connection element and the extension frame.

According to one of the above embodiments, the second bracket comprises a side plate, an end plate substantially perpendicularly extended from the side plate, and a mounting element mounted to the end plate. The blocking element is pivoted to the side plate of the second bracket and comprises a guiding feature and a blocking part. The guiding feature of the blocking element is inclined. The elastic element is attached to the extension frame for providing the elastic force to the guiding feature of the blocking element. Wherein, when the blocking element is driven to rotate in response to a movement of the elastic element when applying the elastic force to the guiding feature, the blocking part of the blocking element is moved from the first position to the second position relative the mounting element of the second bracket. One of the extension frame and the second bracket further comprises at least one extension hole. The slide rail assembly further comprises at least one connection element passing through the at least one extension hole for movably mounting the extension frame to the second bracket. At least one spring is connected between the at least one connection element and the extension frame.

According to one of the above embodiments, the second bracket comprises a side plate, an end plate substantially perpendicularly extended from the side plate, and a mounting element mounted to the end plate. The blocking element is pivoted to the side plate of the second bracket and comprises a contact part and a blocking part. The elastic element is attached to the side plate of the second bracket for abutting against the blocking element. The blocking part of the blocking element is held at the first position relative to the mounting element of the second bracket in response to the elastic force of the elastic element. The blocking element comprises a guiding feature, and the guiding feature is inclined. The extension frame comprises a contact feature. The contact feature is a rod-shaped object for abutting against the guiding feature of the blocking element. Wherein, when the blocking element is driven to rotate in response to a movement of the contact feature of the extension frame when abutting against the guiding feature, the blocking part of the blocking element is moved from the first position to the second position relative to the mounting element of the second bracket. One of the extension frame and the second bracket further comprises at least one extension hole. The slide rail assembly further comprises at least one connection element passing through the at least one extension hole for movably mounting the extension frame to the second bracket. The slide rail assembly further comprises at least one spring connected between the at least one connection element and the extension frame.

The embodiments of the present invention are characterized in that: the slide rail assembly is capable of being easily mounted to or detached from a rack by a single person when operating in front of the rack.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 is a diagram showing a first bracket and a second bracket of the slide rail assembly mounted to a first post and a second post of the rack according to the first embodiment of the present invention.

FIG. 5 is a diagram showing the first bracket of the slide rail assembly detached from the first post of the rack according to the first embodiment of the present invention.

FIG. 6 is a diagram illustrating an operation (1) for detaching the second bracket of the slide rail assembly from the second post of the rack according to the first embodiment of the present invention.

FIG. 7 is a diagram illustrating an operation (2) for detaching the second bracket of the slide rail assembly from the second post of the rack according to the first embodiment of the present invention.

DETAILED DESCRIPTION

Figure 1:
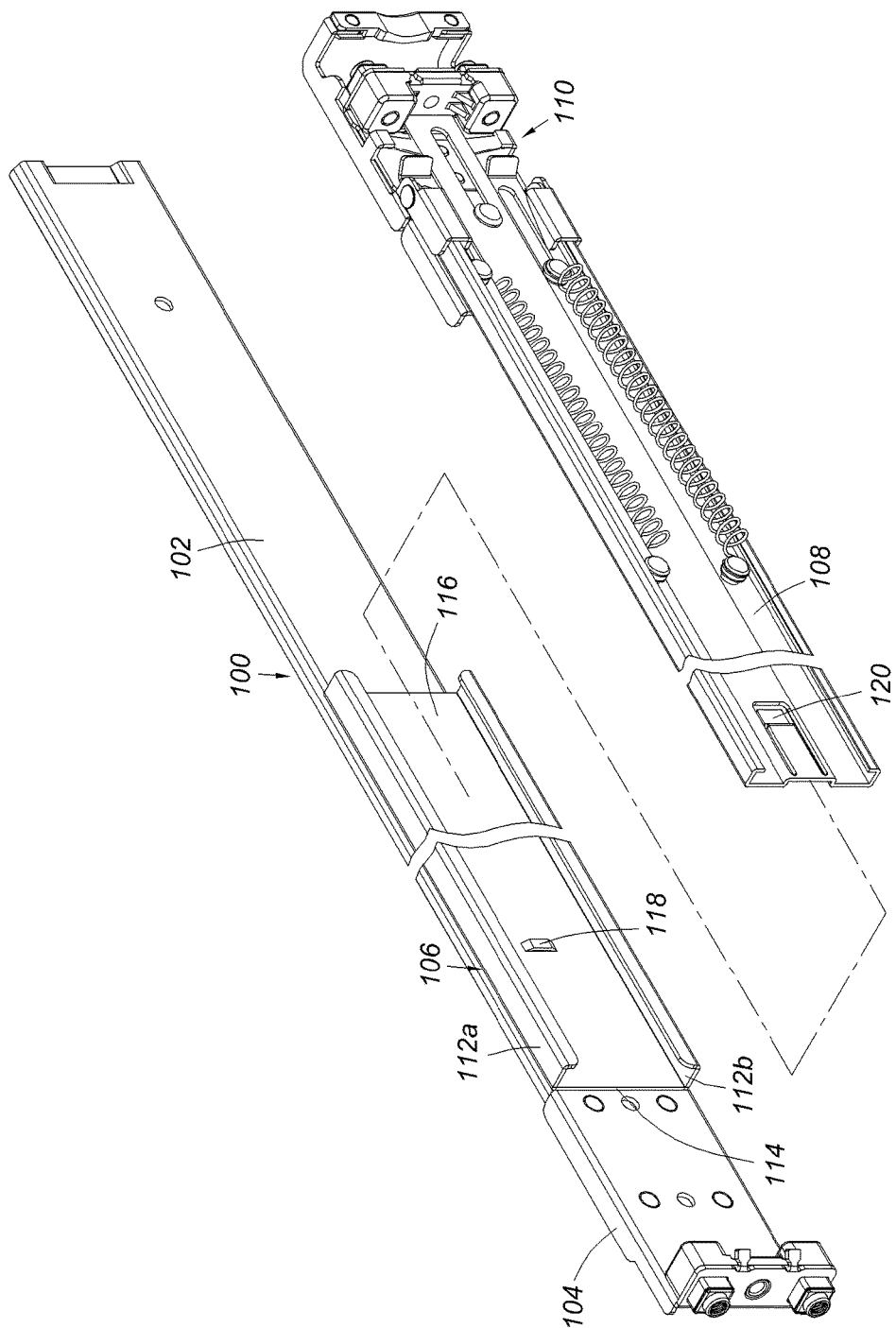
FIG. 1 is an exploded view of a slide rail assembly according to a first embodiment of the present invention.

FIG. 1 is a diagram showing a slide rail assembly 100 according to a first embodiment of the present invention. The slide rail assembly 100 comprises a rail element 102, a first bracket 104, a supporting frame 106, an extension frame 108, and a second bracket 110. The first bracket 104 is mounted to the rail element 102 to be adjacent to a front end of the rail element 102. The supporting frame 106 is fixedly mounted to the rail element 102 as a part of the rail element 102. The supporting frame 106 has an upper wall 112a, a lower wall 112b, and a side wall 114 extended between the upper wall 112a and the lower wall 112b. A passage 116 is defined by the upper wall 112a and the lower wall 112b. The side wall 114 comprises a first part 118 (such as a bump) arranged in the passage 116. The extension frame 108 is movably mounted to the supporting frame 106. Therefore, the extension frame 108 is movable relative to the rail element 102. At least one part of the extension frame 108 is correspondingly mounted in the passage 116 of the supporting frame 106 and capable of moving longitudinally relative to the rail element 102. The extension frame 108 comprises a second part 120 corresponding to the first part 118 of the supporting frame 106. The second bracket 110 is mounted to the extension frame 108, that is to say, the second bracket 110 is movable relative to the rail element 102, and can move to be adjacent to a rear end of the rail element 102.

Figure 2:
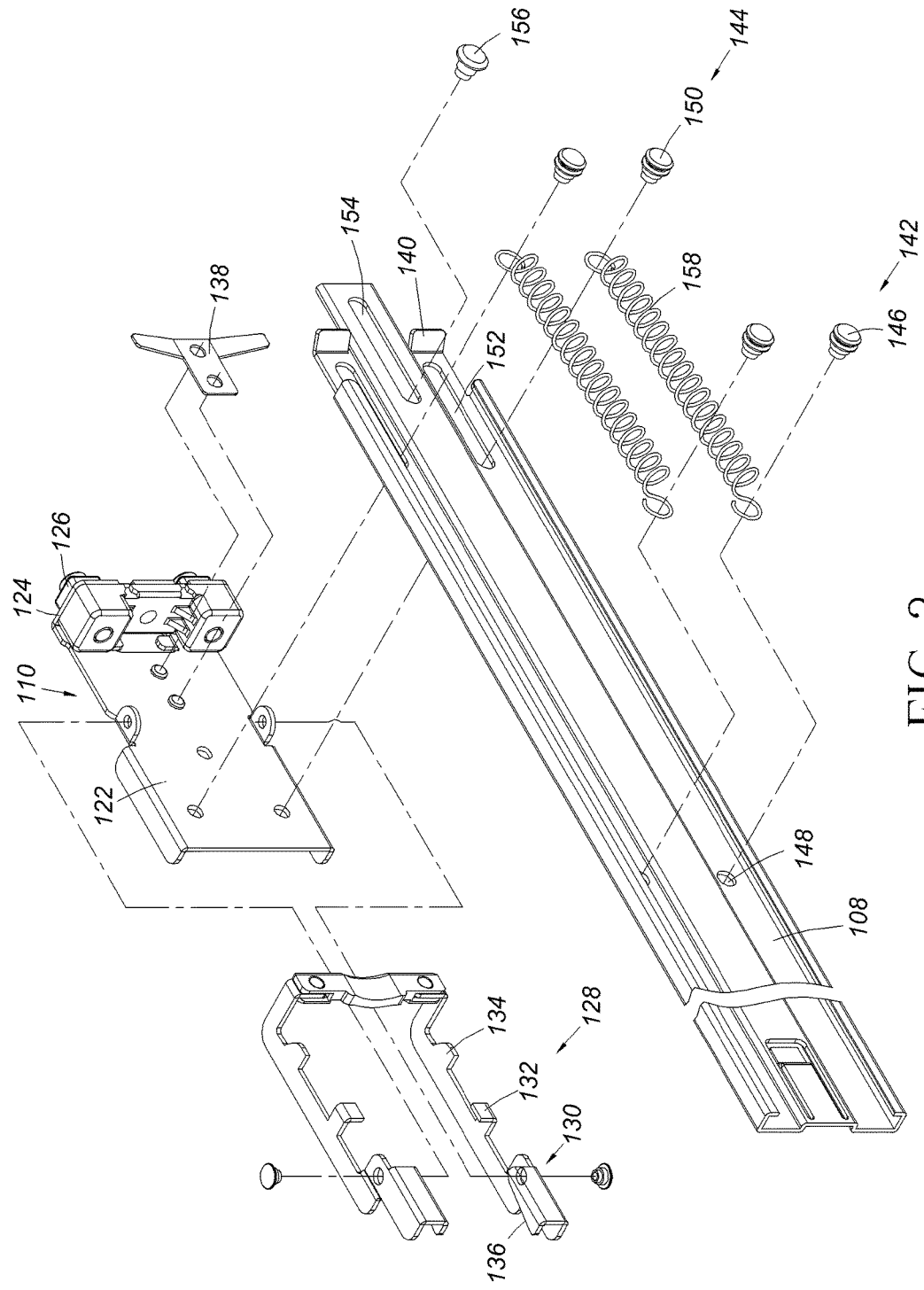
FIG. 2 is an exploded view of a second bracket and an extension frame of the slide rail assembly according to the first embodiment of the present invention.

As shown in FIG. 2, the second bracket 110 comprises a side plate 122, an end plate 124 substantially perpendicularly extended from an end of the side plate 122, and at least one mounting element 126 mounted to the endplate 124. The slide rail assembly 100 further comprises at least one blocking element 128 movably connected (such as pivoted) to the side plate 122 of the second bracket 110. The blocking element 128 comprises a guiding part 130, a contact part 132 and a blocking part 134. The guiding part 130 has an inclined guiding feature 136. In addition, the slide rail assembly 100 further comprises an elastic element 138 attached to the side plate 122 of the second bracket 110. One end of the extension frame 108 is arranged with at least one inclined contact feature 140 corresponding to the guiding feature 136 of the blocking element 128. The extension frame 108 further comprises a first supporting feature 142 and at least one second supporting feature 144. The first supporting feature 142 is mounted to a fixing hole 148 of the extension frame 108 by at least one first connection element 146. The second supporting feature 144 is connected to the side plate 122 of the second bracket 110 by correspondingly penetrating a portion of at least one second connection element 150 through at least one first extension hole 152 of the extension frame 108. Another portion of the at least one second connection element 150 is blocked at one side of the extension frame 108, in order to movably mount the extension frame 108 to the second bracket 110, such that the extension frame 108 can move relative to the side plate 122 of the second bracket 110 within a limited range defined by the at least one first extension hole 152. Preferably, the extension frame 108 is further formed with a second extension hole 154 for allowing a portion of a third connection element 156 to correspondingly pass through and to be connected to the side plate 122 of the second bracket 110. Wherein, the slide rail assembly 100 can further comprise at least one spring 158 correspondingly connected between the at least one first connection element 146 and the at least one second connection element 150.

Figure 3:
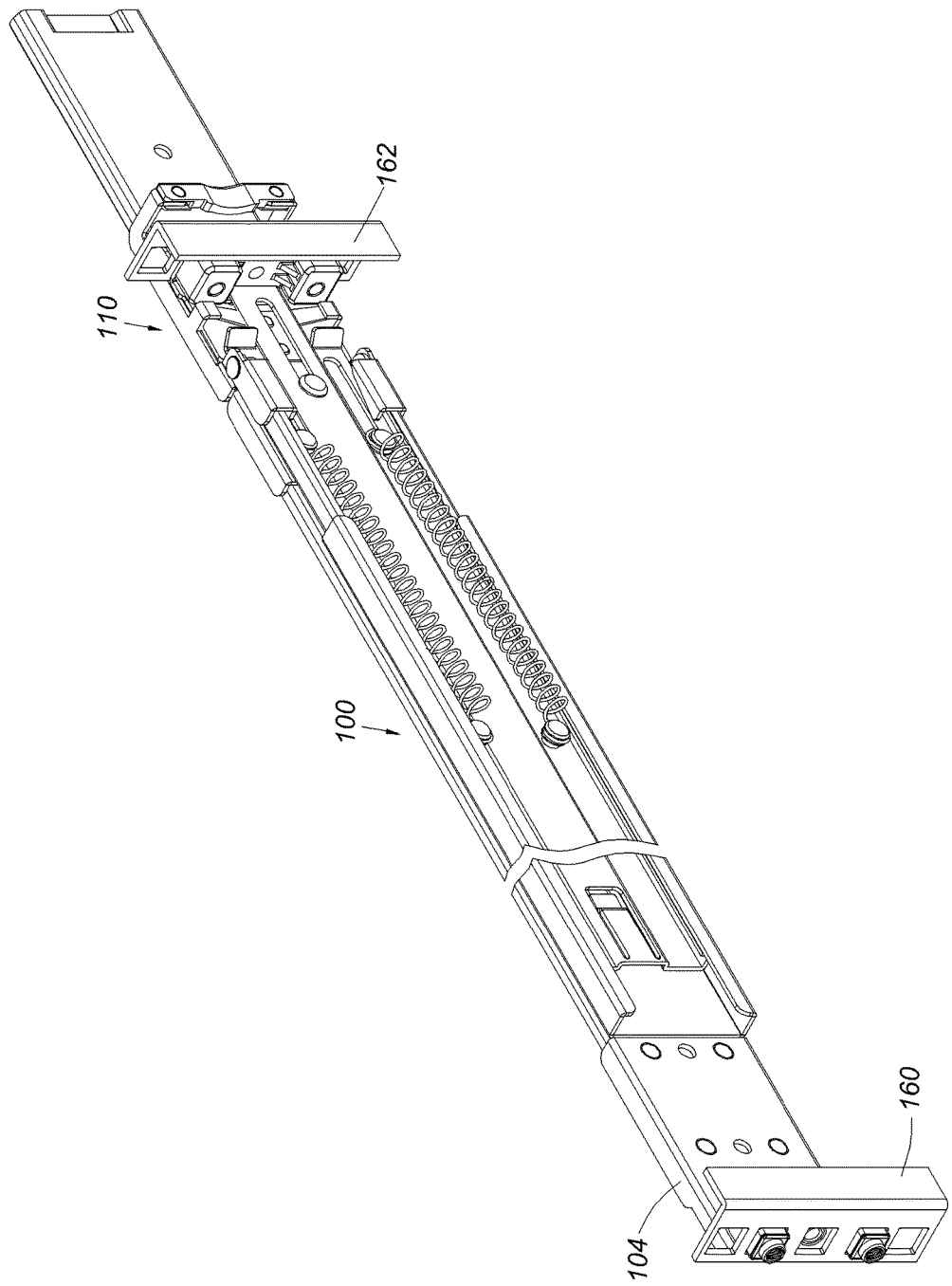
FIG. 3 is a diagram showing the slide rail assembly mounted to a rack according to the first embodiment of the present invention.

As shown in FIG. 3 and FIG. 4, the slide rail assembly 100 is mounted to a first post 160 and a second post 162 of a rack by the first bracket 104 and the second bracket 110 respectively. The first part 118 of the supporting frame 106 of the slide rail assembly 100 corresponds to the second part 120 of the extension frame 108 from a predetermined distance. The elastic element 138 is configured to provide an elastic force to hold the blocking element 128 at a first position P1 relative to the second bracket 110. In the present embodiment, the elastic element 138 abuts against the contact part 132 of the blocking element 128 for providing the elastic force to the contact part 132 of the blocking element 128, such that the blocking part 134 of the blocking element 128 is held at the first position P1 relative to the mounting element 126 (or the end plate 124) of the second bracket 110 in response to the elastic force of the elastic element 138. Therefore, the blocking part 134 of the blocking element 128 corresponds to or faces toward the second post 162 to ensure that the second bracket 110 is not detachable from the second post 162.

FIG. 5 is a diagram showing the first bracket 104 of the slide rail assembly 100 being detached from the first post 160 of the rack. Firstly, a positioning condition between the first bracket 104 and the first post 160 of the rack can be removed, such as removing a fixing element or other type of component (not shown) attached to the first post 160. Thereafter, the slide rail assembly 100 is slightly pushed to move toward the second post 162 of the rack (such as a direction indicated by an arrow shown in the figure), such that the first bracket 104 of the slide rail assembly 100 can be detached from the first post 160 of the rack.

As shown in FIG. 6, the slide rail assembly 100 is pulled out to move along a direction F1 (such as a direction opposite to a direction toward the second post 162), such that the first part 118 of the supporting frame 106 of the slide rail assembly 100 abuts against the second part 120 of the extension frame 108.

As shown in FIG. 7, when the slide rail assembly 100 is continuously pulled out to move along the direction F1, the extension frame 108 is driven to move along the direction F1 by the first part 118 of the supporting frame 106 of the slide rail assembly 100, such that the contact feature 140 of the extension frame 108 abuts against the guiding feature 136 of the guiding part 130 of the blocking element 128.

Figure 8:
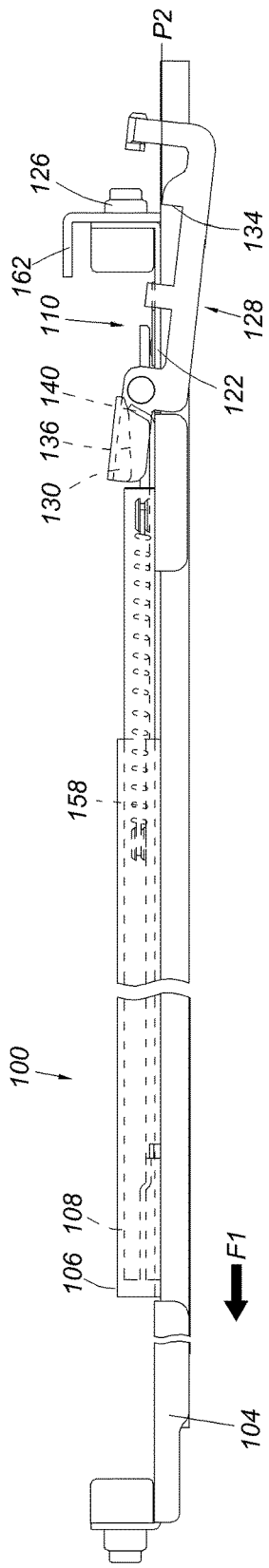
FIG. 8 is a diagram illustrating an operation (3) for detaching the second bracket of the slide rail assembly from the second post of the rack according to the first embodiment of the present invention.
Figure 9:
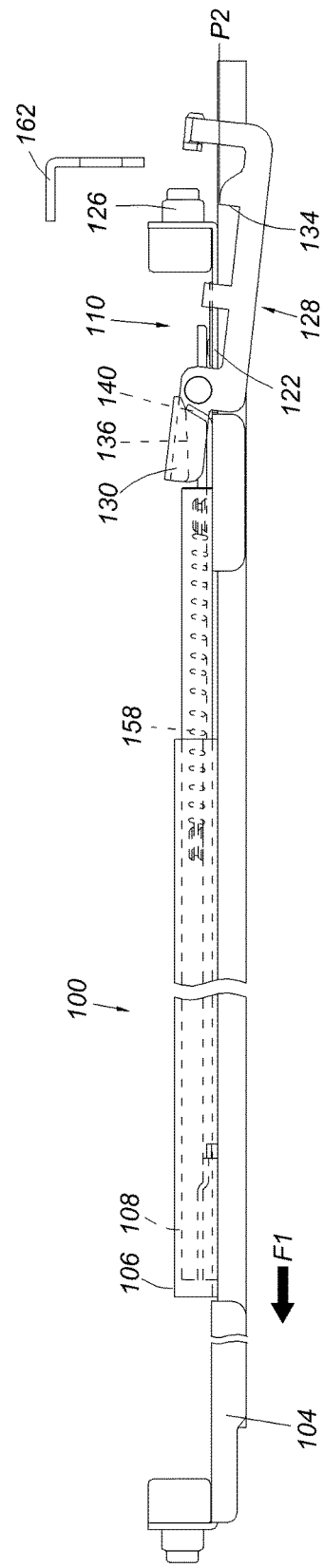
FIG. 9 is a diagram illustrating an operation (4) for detaching the second bracket of the slide rail assembly from the second post of the rack according to the first embodiment of the present invention.

As shown in FIG. 8 and FIG. 9, when the slide rail assembly 100 is continuously pulled out to move along the direction F1, since the contact feature 140 of the extension frame 108 abuts against the guiding feature 136 of the guiding part 130 of the blocking element 128 at a predetermined position, the blocking element 128 is driven to rotate in response to a movement of the contact feature 140 of the extension frame 108 when abutting against the guiding feature 136 of the guiding part 130, so as to move the blocking part 134 of the blocking element 128 from the first position P1 to a second position P2 relative to the mounting element 126. Meanwhile, the blocking part 134 of the blocking element 128 no longer corresponds to or faces toward the second post 162, such that the second bracket 110 can be detached from the second post 162. Therefore, a user standing in front of the first post 160 of the rack can detach the slide rail assembly 100 from the first post 160 and the second post 162, so as to allow the user to operate conveniently and quickly. In another embodiment, the extension frame 108 can also be extended to be adjacent to the first bracket 104 and beyond the supporting frame 106, for allowing the user to directly pull the extension frame 108 in order to detach the blocking element 128 from the second post 162. When a force applied along the direction F1 no longer exists, original relative positions between the extension frame 108 and the side plate 122 of the second bracket 110 can be recovered by the elastic force of the elastic element 158.

Figure 10:
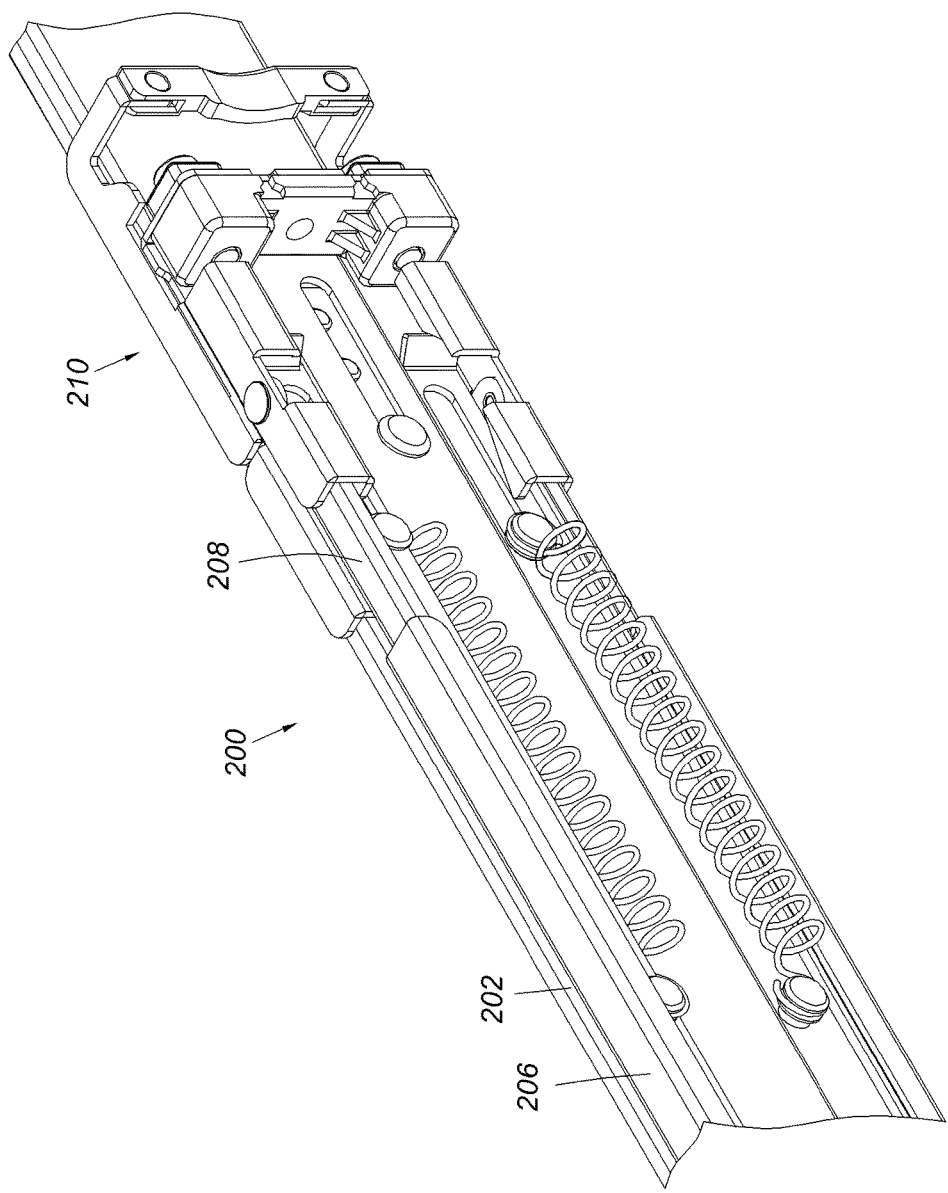
FIG. 10 is a diagram showing part of a slide rail assembly according to a second embodiment of the present invention.

FIG. 10 is a diagram showing a slide rail assembly 200 according to a second embodiment of the present invention. The slide rail assembly 200 comprises a rail element 202, a first bracket (not shown), a supporting frame 206, an extension frame 208, and a second bracket 210. The supporting frame 206 is fixedly mounted to the rail element 202 as a part of the rail element 202. The extension frame 208 is movably mounted to the supporting frame 206. The second bracket 210 is mounted to the extension frame 208.

Figure 11:
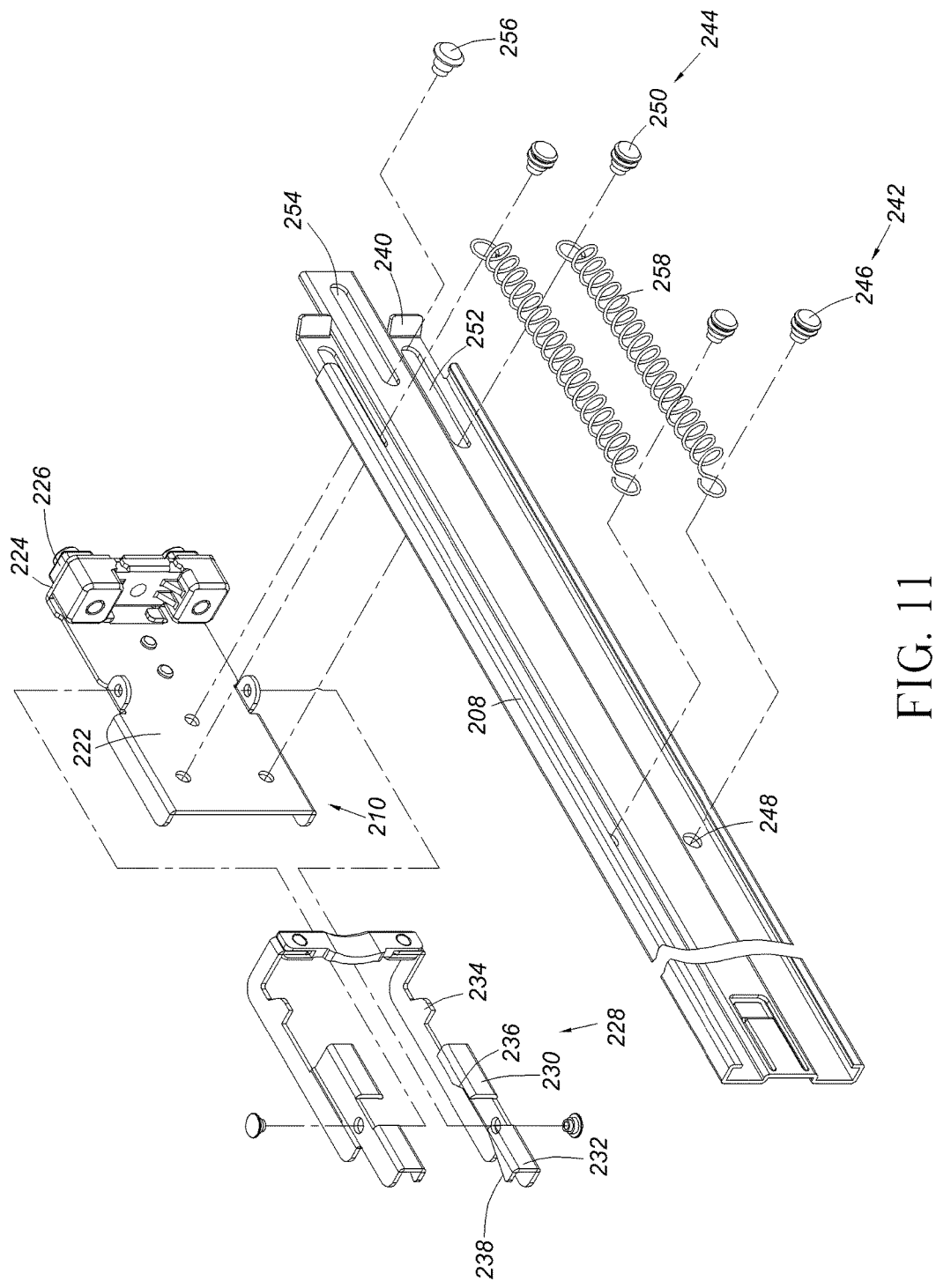
FIG. 11 is an exploded view of a second bracket and an extension frame of the slide rail assembly according to the second embodiment of the present invention.

FIG. 11 further shows the second bracket 210 comprising a side plate 222, an end plate 224 substantially perpendicularly extended from an end of the side plate 222, and at least one mounting element 226 mounted to the endplate 224. The slide rail assembly 200 further comprises at least one blocking element 228 movably connected (such as pivoted) to the side plate 222 of the second bracket 210. The blocking element 228 comprises a first guiding part 230, a second guiding part 232 and a blocking part 234. The first guiding part 230 has a first guiding feature 236. The second guiding part 232 has a second guiding feature 238. The first guiding feature 236 and the second guiding feature 238 are inclined in different directions. In addition, one end of the extension frame 208 is arranged with at least one inclined contact feature 240 corresponding to the first guiding feature 236 and the second guiding feature 238 of the blocking element 228. The extension frame 208 further comprises a first supporting feature 242 and at least one second supporting feature 244. The first supporting feature 242 is mounted to a fixing hole 248 of the extension frame 208 by a first connection element 246. The second supporting feature 244 is connected to the side plate 222 of the second bracket 210 by correspondingly penetrating a portion of at least one second connection element 250 through a first extension hole 252 of the extension frame 208. Another portion of the at least one second connection element 250 is blocked at one side of the extension frame 208, in order to movably mount the extension frame 208 to the second bracket 210, such that the extension frame 208 can move relative to the side plate 222 of the second bracket 210 within a limited range defined by the at least one first extension hole 252. Preferably, the extension frame 208 is further formed with a second extension hole 254 for allowing a portion of a third connection element 256 to correspondingly pass through and to be connected to the side plate 222 of the second bracket 210. In addition, the slide rail assembly 200 further comprises an elastic element 258, which can be at least one spring, connected between the first connection element 246 and the second connection element 250.

Figure 12:
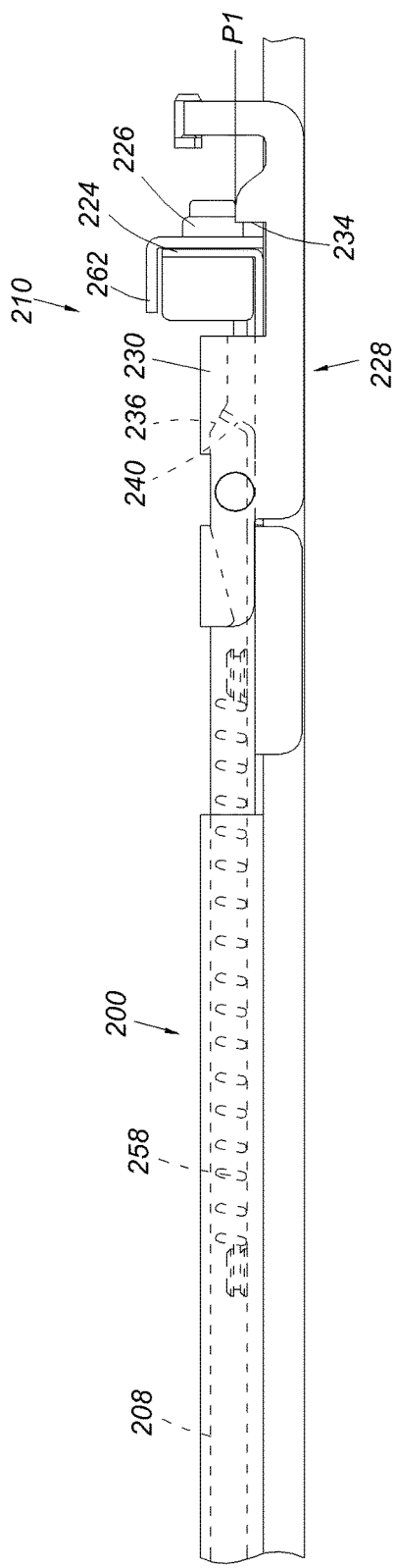
FIG. 12 is a diagram showing the second bracket of the slide rail assembly mounted to the second post of the rack according to the second embodiment of the present invention.

As shown in FIG. 12, the contact feature 240 of the extension frame 208 is driven to abut against the first guiding feature 236 of the first guiding part 230 of the blocking element 228 by an elastic force generated by the elastic element 258, in order to hold the blocking part 234 of the blocking element 228 at a first position P1 relative to the second bracket 210. For example, the blocking part 234 of the blocking element 228 is held at the first position P1 relative to the mounting element 226 (or the end plate 224) of the second bracket 210, such that the blocking part 234 of the blocking element 228 corresponds to or faces toward the second post 262 to ensure that the second bracket 210 is not detachable from the second post 262.

Figure 13:
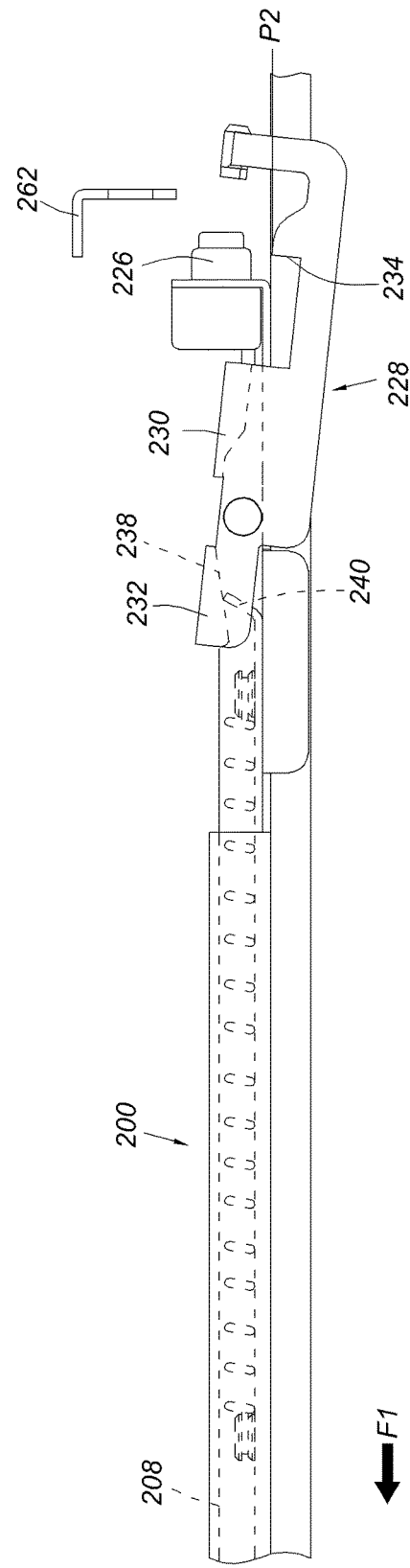
FIG. 13 is a diagram showing an operation for detaching the second bracket of the slide rail assembly from the second post of the rack according to the second embodiment of the present invention.

As shown in FIG. 13, after detaching the first bracket of the slide rail assembly 200 from the first post of the rack (not shown), the extension frame 208 is pulled out to move along a direction F1 (such as a direction opposite to a direction toward the second post 262) in order to move the contact feature 240 of the extension frame 208 away from the first guiding feature 236 of the first guiding part 230 of the blocking element 228 to abut against the second guiding feature 238 of the second guiding part 232 of the blocking element 228 at a predetermined position. Meanwhile, the blocking element 228 is driven to rotate in response to a movement of the contact feature 240 of the extension frame 208 when abutting against the second guiding feature 238, so as to move the blocking part 234 of the blocking element 228 from the first position P1 to a second position P2, such that the second bracket 210 can be detached from the second post 262. According to such arrangement, a user standing in front of the first post of the rack can detach the slide rail assembly 200 from the first post and the second post, so as to allow the user to operate conveniently and quickly.

Figure 14:
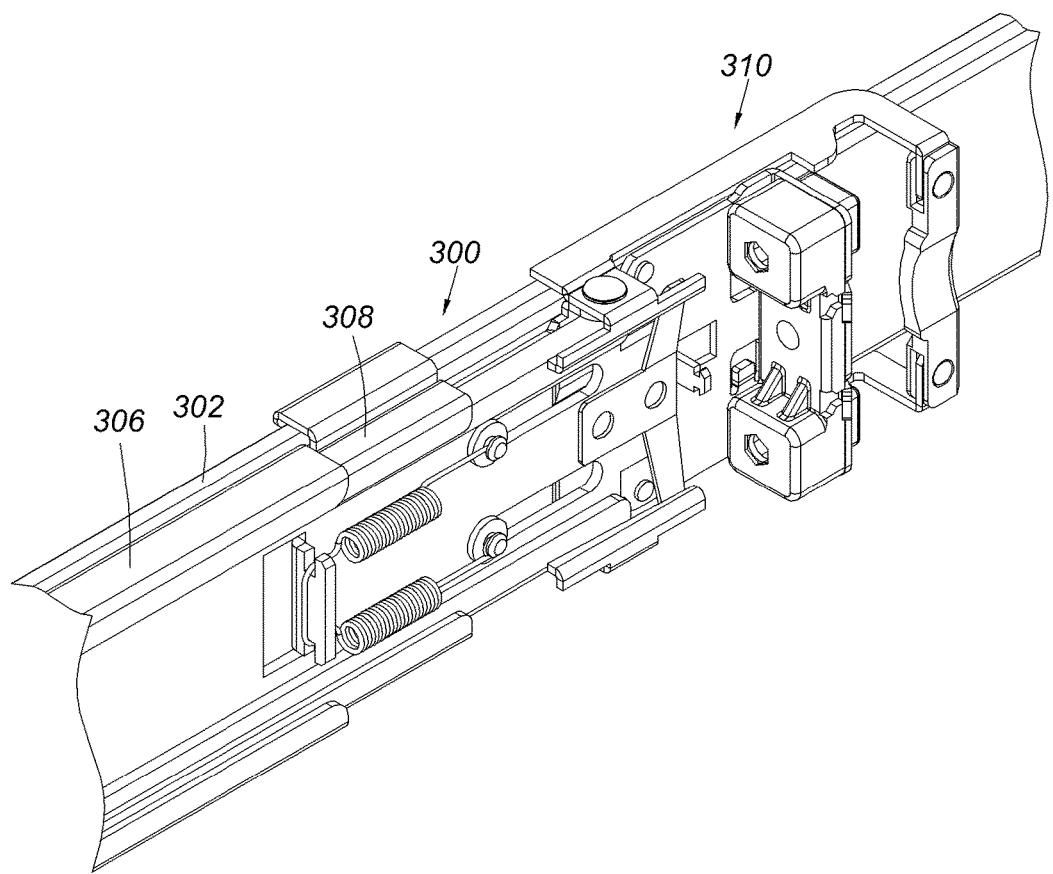
FIG. 14 is a diagram showing part of a slide rail assembly according to a third embodiment of the present invention.

FIG. 14 is a diagram showing a slide rail assembly 300 according to a third embodiment of the present invention. The slide rail assembly 300 comprises a rail element 302, a first bracket (not shown), a supporting frame 306, an extension frame 308 and a second bracket 310. The supporting frame 306 is fixedly mounted to the rail element 302 as a part of the rail element 302. The extension frame 308 is movably mounted to the supporting frame 306. The second bracket 310 is mounted to the extension frame 308.

Figure 15:
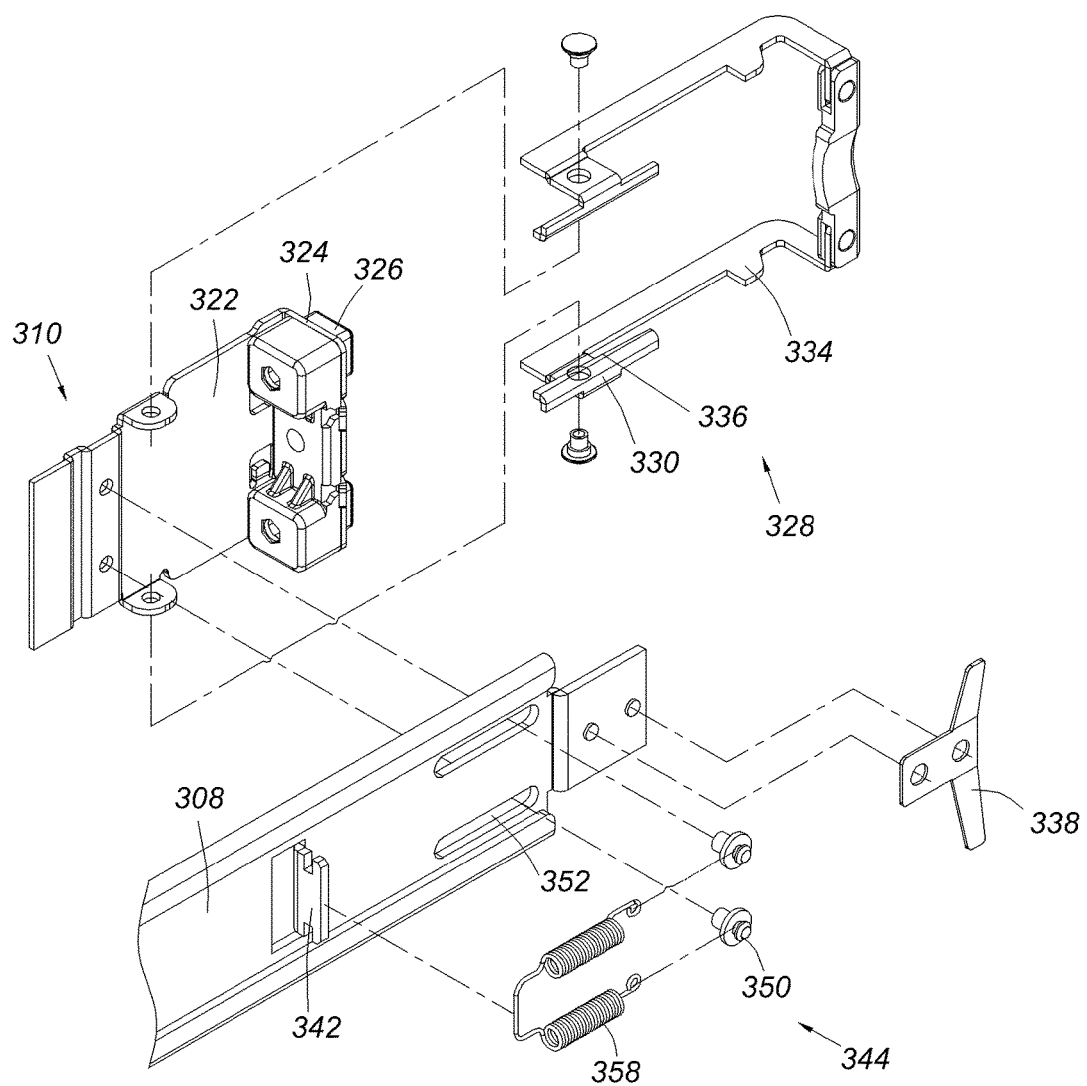
FIG. 15 is an exploded view of a second bracket and an extension frame of the slide rail assembly according to the third embodiment of the present invention.

FIG. 15 further shows the second bracket 310 comprising a side plate 322, an end plate 324 substantially perpendicularly extended from an end of the side plate 322, and at least one mounting element 326 mounted to the endplate 324. The slide rail assembly 300 further comprises at least one blocking element 328 movably connected (such as pivoted) to the side plate 322 of the second bracket 310. The blocking element 328 comprises a guiding part 330 and a blocking part 334. The guiding part 330 has an inclined guiding feature 336. In addition, the slide rail assembly 300 further comprises an elastic element 338 attached to one end of the extension frame 308. The extension frame 308 further comprises a first supporting feature 342 and at least one second supporting feature 344. The first supporting feature 342, such as a protrusion, is extended from the extension frame 308. The second supporting feature 344 is connected to the side plate 322 of the second bracket 310 by correspondingly penetrating a portion of at least one connection element 350 through at least one extension hole 352 of the extension frame 308. Another portion of the at least one connection element 350 is blocked at one side of the extension frame 308 in order to movably mount the extension frame 308 to the second bracket 310, such that the extension frame 308 can move relative to the side plate 322 of the second bracket 310 within a limited range defined by the at least one extension hole 352. Preferably, the slide rail assembly 300 further comprises at least one spring 358 connected between the first supporting feature 342 of the extension frame 308 and the at least one connection element 350.

Figure 16:
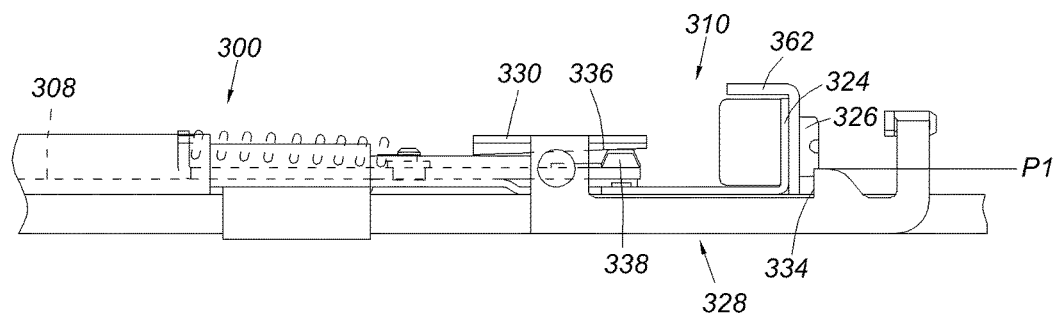
FIG. 16 is a diagram showing the second bracket of the slide rail assembly mounted to the second post of the rack according to the third embodiment of the present invention.

As shown in FIG. 16, the elastic element 338 is configured to provide an elastic force to hold the blocking element 328 at a first position P1 relative to the second bracket 310. In the present embodiment, the elastic element 338 abuts against the guiding feature 336 of the blocking element 328 and works as a contact feature of the extension frame 308. The elastic element 338 provides an elastic force to the guiding feature 336 of the guiding part 330 of the blocking element 328, such that the blocking part 334 of the blocking element 328 is held at the first position P1 relative to the mounting element 326 (or the end plate 324) of the second bracket 310 in response to the elastic force of the elastic element 338. Therefore, the blocking part 334 of the blocking element 328 corresponds to or faces toward the second post 362 to ensure that the second bracket 310 is not detachable from the second post 362.

Figure 17:
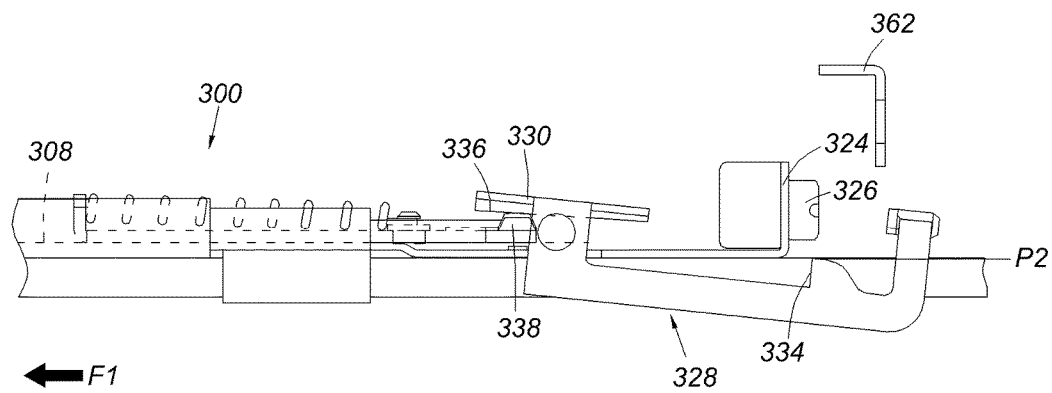
FIG. 17 is a diagram illustrating an operation for detaching the second bracket of the slide rail assembly from the second post of the rack according to the third embodiment of the present invention.

As shown in FIG. 17, after detaching the first bracket of the slide rail assembly 300 from the first post of the rack (not shown), the extension frame 308 is pulled out along a direction F1 (such as a direction opposite to a direction toward the second post 362) to move to a predetermined position, such that the elastic force of the elastic element 338 is continuously applied to push the guiding feature 336 of the guiding part 330 of the blocking element 328 harder. Meanwhile, the blocking element 328 is driven to rotate in response to a movement of the elastic element 338 of the extension frame 308 when applying the elastic force to the guiding feature 336 of the blocking element 328, so as to move the blocking part 334 of the blocking element 328 from the first position P1 to a second position P2 relative to the mounting element 326, such that the second bracket 310 can be detached from the second post 362. According to such arrangement, a user standing in front of the first post of the rack can detach the slide rail assembly from the first post and the second post, so as to allow the user to operate conveniently and quickly.

Figure 18:
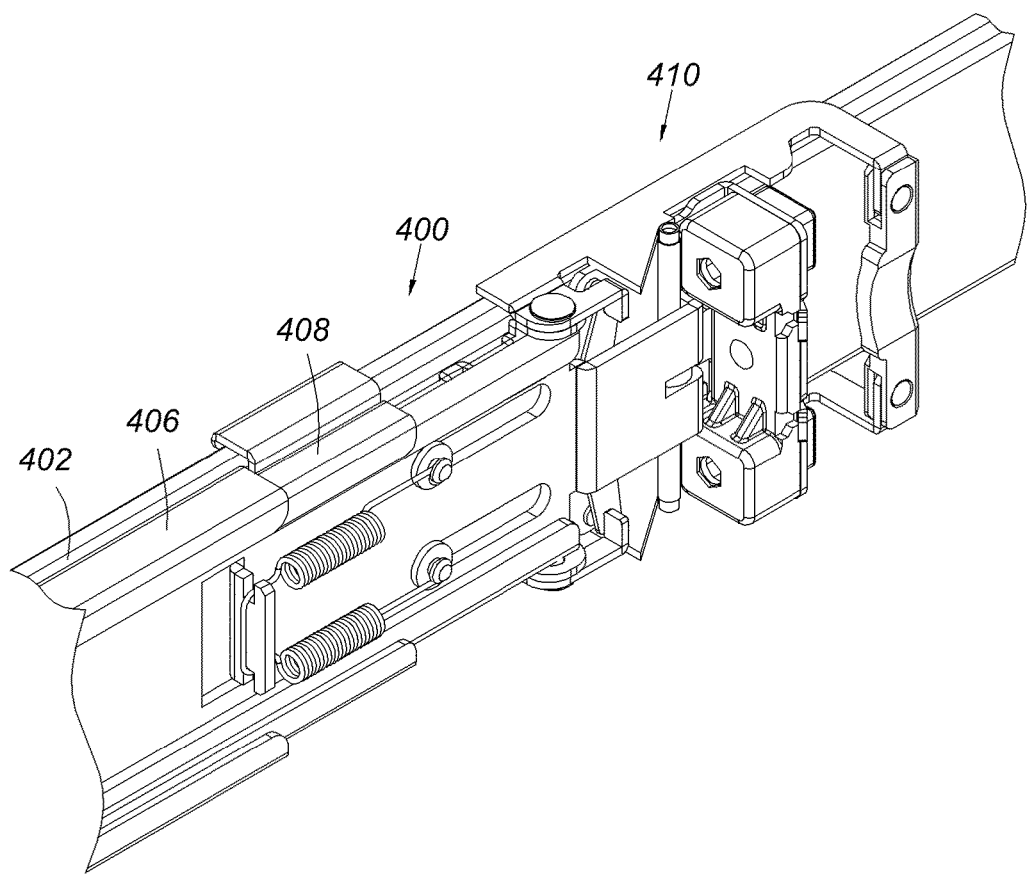
FIG. 18 is a diagram showing part of a slide rail assembly according to a fourth embodiment of the present invention.

FIG. 18 is a diagram showing a slide rail assembly 400 according to a fourth embodiment of the present invention. The slide rail assembly 400 comprises a rail element 402, a first bracket (not shown), a supporting frame 406, an extension frame 408 and a second bracket 410. The supporting frame 406 is fixedly mounted to the rail element 402 as a part of the rail element 402. The extension frame 408 is movably mounted to the supporting frame 406. The second bracket 410 is mounted to the extension frame 408.

Figure 19:
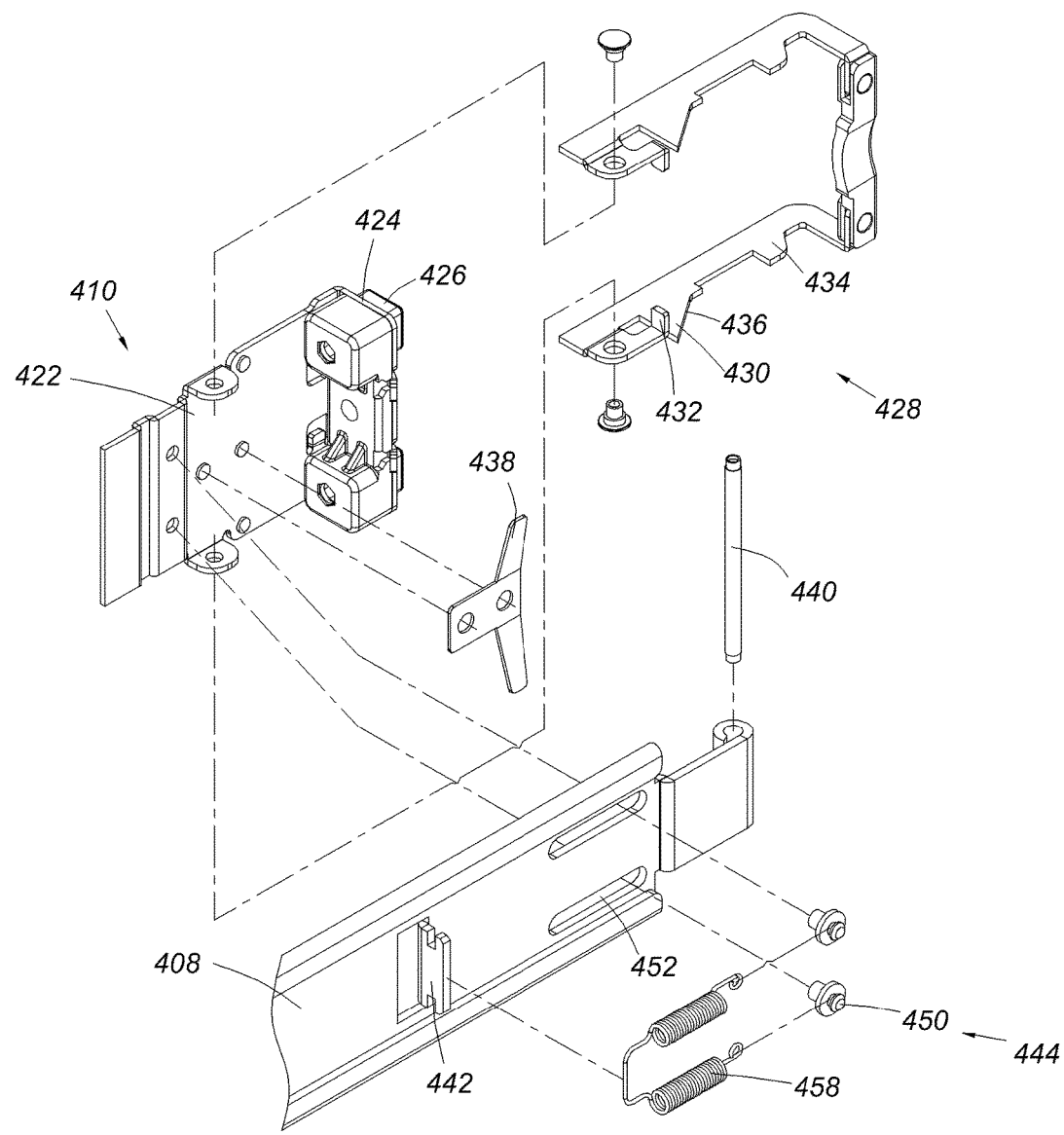
FIG. 19 is an exploded view of a second bracket and an extension frame of the slide rail assembly according to the fourth embodiment of the present invention.

FIG. 19 further shows the second bracket 410 comprising a side plate 422, an end plate 424 substantially perpendicularly extended from an end part of the side plate 422, and at least one mounting element 426 mounted to the end plate 424. The slide rail assembly 400 further comprises at least one blocking element 428 movably connected (such as pivoted) to the side plate 422 of the second bracket 410. The blocking element 428 comprises a guiding part 430, a contact part 432 and a blocking part 434. The guiding part 430 has an inclined guiding feature 436. In addition, the slide rail assembly 400 further comprises an elastic element 438 attached to the side plate 422 of the second bracket 410. One end of the extension frame 408 is arranged with a rod-shaped contact feature 440 corresponding to the guiding feature 436 of the blocking element 428. The extension frame 408 further comprises a first supporting feature 442 and at least one second supporting feature 444. The first supporting feature 442, such as a protrusion, is extended from the extension frame 408. The second supporting feature 444 is connected to the side plate 422 of the second bracket 410 by correspondingly penetrating a portion of at least one connection element 450 through at least one extension hole 452 of the extension frame 408. Another portion of the at least one connection element 450 is blocked at one side of the extension frame 408 in order to movably mount the extension frame 408 to the second bracket 410. Therefore, the extension frame 408 can move relative to the side plate 422 of the second bracket 410 within a limited range defined by the at least one extension hole 452. The slide rail assembly 400 can further comprise at least one spring 458 connected between the first supporting feature 442 of the extension frame 408 and the at least one connection element 450.

Figure 20:
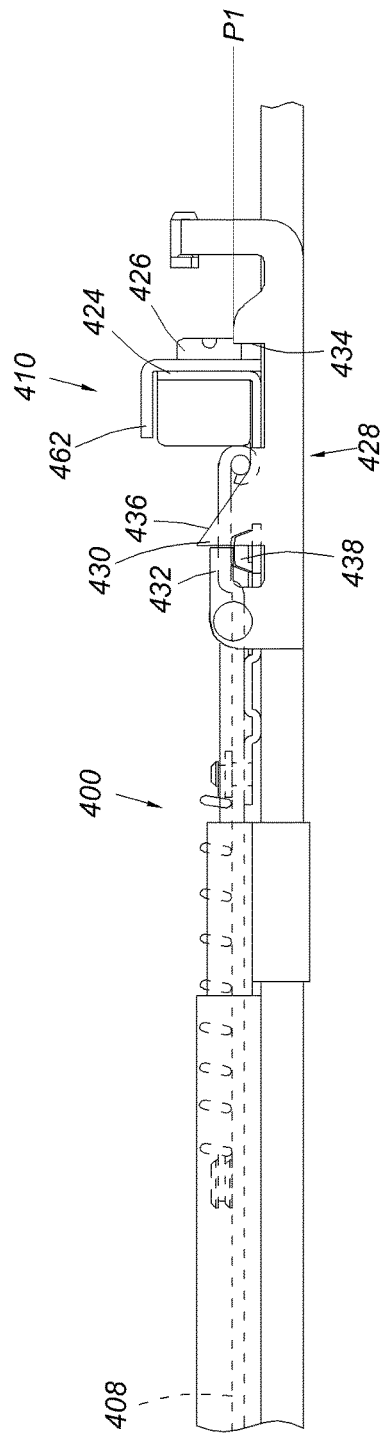
FIG. 20 is a diagram showing the second bracket of the slide rail assembly mounted to the second post of the rack according to the fourth embodiment of the present invention.

As shown in FIG. 20, the elastic element 438 is configured to provide an elastic force to hold the blocking element 428 at a first position relative to the second bracket 410. In the present embodiment, the elastic element 438 provides an elastic force to the contact part 432 of the blocking element 428, such that the blocking part 434 of the blocking element 428 is held at the first position P1 relative to the mounting element 426 (or the endplate 424) of the second bracket 410 in response to the elastic force of the elastic element 438. Therefore, the blocking part 434 of the blocking element 428 corresponds to or faces toward the second post 462 to ensure that the second bracket 410 is not detachable from the second post 462.

Figure 21:
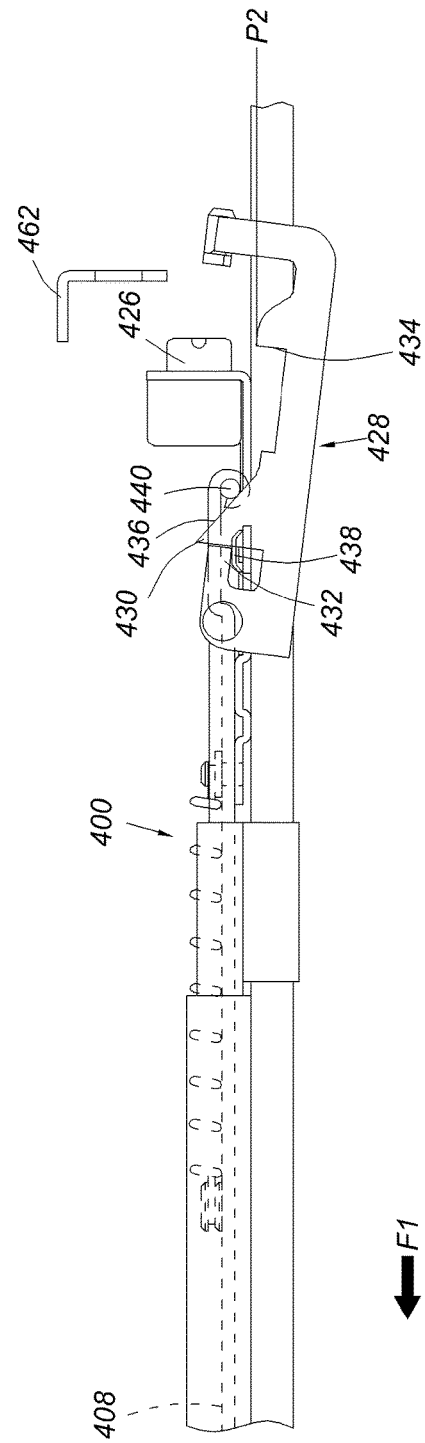
FIG. 21 is a diagram illustrating an operation for detaching the second bracket of the slide rail assembly from the second post of the rack according to the fourth embodiment of the present invention.

As shown in FIG. 21, after detaching the first bracket of the slide rail assembly 400 from the first post of the rack (not shown), the extension frame 408 is pulled out to move along a direction F1 (such as a direction opposite to a direction toward the second post 462), such that the contact feature 440 of the extension frame 408 abuts against the guiding feature 436 of the guiding part 430 of the blocking element 428 and is moved to a predetermined position. Meanwhile, the blocking element 428 is driven to rotate in response to a movement of the extension frame 408, so as to move the blocking part 434 of the blocking element 428 from the first position P1 to a second position P2 relative to the mounting element 426, such that the second bracket 410 can be detached from the second post 462. According to such arrangement, a user standing in front of the first post of the rack can detach the slide rail assembly from the first post and the second post, so as to allow the user to operate conveniently and quickly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide assembly, configured to be mounted to a first post and a second post of a rack, the slide assembly comprising:
    a rail element;
    a first bracket mounted to the rail element and configured to be mounted to the first post of the rack;
    an extension frame movable relative to the rail element;
    a second bracket mounted to the extension frame and configured to be mounted to the second post of the rack, wherein the second bracket comprises a side plate, an end plate substantially perpendicularly extended from the side plate, and at least one mounting element mounted to the end plate;

a blocking element movably connected to the second bracket, wherein the blocking element is pivoted to the side plate of the second bracket and comprises a contact part and a blocking part; and an elastic element configured to provide an elastic force to hold the blocking element at a first position relative to the second bracket;

wherein when the extension frame is moved along a direction opposite to a direction toward the second post for pushing the blocking element to move from the first position to a second position, the second bracket is detachable from the second post;

wherein the elastic element is attached to the side plate of the second bracket for providing the elastic force to the contact part of the blocking element, the blocking part of the blocking element is held at the first position relative to the mounting element of the second bracket in response to the elastic force of the elastic element.

2. The slide rail assembly of claim 1, wherein the blocking element further comprises a guiding feature, the extension frame comprises a contact feature for abutting against the guiding feature of the blocking element, one of the guiding feature of the blocking element and the contact feature of the extension frame is inclined, when the blocking element is driven to rotate in response to a movement of the contact feature of the extension frame when abutting against the guiding feature, the blocking part of the blocking element is moved from the first position to the second position relative to the mounting element of the second bracket.

3. The slide rail assembly of claim 1, wherein one of the extension frame and the second bracket further comprises at least one extension hole, the slide rail assembly further comprises at least one connection element passing through the at least one extension hole for movably mounting the extension frame to the second bracket.

4. The slide rail assembly of claim 3, further comprising at least one spring connected between the at least one connection element and the extension frame.

* * * * *